US 6,625,073 B1

(12) United States Patent
Beffa

(10) Patent No.: US 6,625,073 B1
(45) Date of Patent: Sep. 23, 2003

(54) APPARATUS AND METHOD FOR TESTING FOR DEFECTS BETWEEN MEMORY CELLS IN PACKAGED SEMICONDUCTOR MEMORY DEVICES

(75) Inventor: Ray Beffa, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/747,214

(22) Filed: Nov. 12, 1996

Related U.S. Application Data

(62) Division of application No. 08/531,226, filed on Sep. 19, 1995, now Pat. No. 5,657,284.

(51) Int. Cl.[7] ............................................. G11C 13/00
(52) U.S. Cl. ........................ 365/201; 365/226; 371/21.3
(58) Field of Search .............................. 365/200, 201, 365/226, 227; 371/21.3

(56) References Cited

U.S. PATENT DOCUMENTS

| | | | |
|---|---|---|---|
| 4,573,146 A | 2/1986 | Graham et al. | 365/200 |
| 4,595,875 A | 6/1986 | Chan et al. | 324/73 PC |
| 4,769,784 A | 9/1988 | Doluca et al. | 365/149 |
| 5,110,754 A | 5/1992 | Lowrey et al. | 437/52 |
| 5,212,442 A | 5/1993 | O'Toole et al. | 324/158 R |
| 5,241,496 A | 8/1993 | Lowrey et al. | 365/96 |
| 5,257,229 A | 10/1993 | McClure et al. | 365/200 |
| 5,291,454 A | 3/1994 | Yamasaki et al. | 365/226 |
| 5,291,455 A | 3/1994 | Feng et al. | 365/226 |
| 5,297,099 A | 3/1994 | Bolan et al. | 365/229 |
| 5,307,318 A | 4/1994 | Nemoto | 365/226 |
| 5,317,532 A | 5/1994 | Ochii | 365/149 |
| 5,355,340 A | 10/1994 | Coker et al. | 365/200 |
| 5,381,373 A | 1/1995 | Ohsawa | 365/201 |
| 5,434,438 A | 7/1995 | Kuo | 257/300 |
| 5,466,888 A | 11/1995 | Beng et al. | 174/52.2 |
| 5,467,356 A | 11/1995 | Choi | 371/21.1 |
| 5,473,198 A | 12/1995 | Hagiya et al. | 257/786 |

(List continued on next page.)

FOREIGN PATENT DOCUMENTS

| | | |
|---|---|---|
| JP | 1-100788 | 4/1989 |
| JP | 6-150697 | 5/1994 |

Primary Examiner—Viet Q. Nguyen
(74) Attorney, Agent, or Firm—Dorsey & Whitney LLP

(57) ABSTRACT

A semiconductor memory device includes a die having a semiconductor memory circuit formed thereon and a plurality of pads at the periphery of the die that are electrically coupled to the circuit. Electrically conductive leads have a pin end for external coupling, and a free end electrically connected by bond wires to certain pads on the die. An encapsulating material such as epoxy encapsulates the die, bond wires and free ends of the leads to form a packaged chip. A superfluous lead such as a redundant voltage supply lead or non-connected lead is coupled, by means of a bond wire, to a pad that, in turn, is coupled to a voltage boosting circuit on the die. The voltage boosting circuit is coupled to row lines in the semiconductor memory circuit to provide boosted voltage thereto. External power can thereby be provided to the row lines, through the voltage boosting circuits, to simultaneously enable at least half of the row lines during stress testing of the chip. The arrangement allows for efficient testing for cell-to-cell defects while the die is in packaged chip form.

24 Claims, 5 Drawing Sheets

U.S. PATENT DOCUMENTS

| | | | |
|---|---|---|---|
| 5,511,029 A | 4/1996 | Sawada et al. | 365/201 |
| 5,535,161 A | 7/1996 | Kato | 365/200 |
| 5,544,106 A | 8/1996 | Koike | 365/200 |
| 5,559,741 A | 9/1996 | Sobue | 365/200 |
| 5,563,832 A | 10/1996 | Kagami | 365/200 |
| 5,590,075 A | 12/1996 | Mazzali | 365/185.22 |
| 5,608,337 A | 3/1997 | Hendricks et al. | 324/765 |
| 5,619,462 A | 4/1997 | McClure | 365/201 |
| 5,621,348 A * | 4/1997 | Furutani et al. | 327/589 |
| 5,627,478 A | 5/1997 | Habersetzer et al. | 324/763 |
| 5,648,730 A | 7/1997 | Bhuva et al. | 324/763 |
| 5,652,725 A * | 7/1997 | Suma et al. | 365/200 |
| 5,657,284 A * | 8/1997 | Beffa | 365/201 |
| 5,768,195 A * | 6/1998 | Nakamura et al. | 365/189.09 |
| 5,885,846 A * | 3/1999 | Beffa | 438/18 |
| 5,965,902 A * | 10/1999 | Beffa | 257/48 |

* cited by examiner

APPARATUS AND METHOD FOR TESTING FOR DEFECTS BETWEEN MEMORY CELLS IN PACKAGED SEMICONDUCTOR MEMORY DEVICES

CROSS-REFERENCE TO RELATED APPLICATION

This application is a divisional of U.S. patent application Ser. No. 08/531,226, filed Sep. 19, 1995 now U.S. Pat. No. 5,657,284.

TECHNICAL FIELD

The present invention relates to apparatus and methods for testing semiconductor electrical devices, particularly memory devices.

BACKGROUND OF THE INVENTION

Various types of defects and failures can occur during the manufacture of semiconductor devices. A "failure" occurs when a semiconductor device fails to meet its specifications. A "defect" occurs when a semiconductor device has an improper circuit structure that currently presents a failure of the device, or has the potential to fail during the expected lifetime of the device. For example, due to a manufacturing error, an insulator or dielectric between a pair of memory cells can be thinned or include polysilicon particles which could currently provide a short therebetween, or could break down over a period of time ("a cell-to-cell defect"). After this period of time, typically during prolonged use of tie device, the polysilicon particle provides a conductive path between the cells so that a "high" voltage written to one cell forces a "low" voltage on an adjacent cell to rise to a high value, resulting in a failure.

Therefore, a polysilicon particle that presently shorts two memory cells together is a defect resulting in a failure of the semiconductor device. A polysilicon particle that has not yet formed a short between the two memory cells, however, is a defect that has not yet evidenced itself as a failure. As a result, the semiconductor device can be operated for a brief time under standard operating conditions and voltages before the defect manifests itself as a failure.

Testing is performed on semiconductor devices to locate defects and failures in such devices. As circuit density on semiconductor devices increases, the number of defects and failures can increase. Semiconductor manufacturers, therefore, have an increasing need to detect for defects and failures in semiconductor devices as circuit density on these devices increases.

Thus, for quality control and to improve yields of acceptably operable semiconductor devices, semiconductor devices are tested, often before a die containing the semiconductor device is packaged into a chip. A series of probes on a test station electrically contact pads on each die in a wafer to thereby access portions of the individual semiconductor devices on the die. For example, in a semiconductor memory device, the probes contact address and data input/output pads to access selected memory cells in the memory device. Typical dynamic random access memory devices ("DRAM") include one or more arrays of memory cells that are each arranged in rows and columns. Each array of memory cells includes word or row lines that select memory cells along a selected row, and bit, digit or column lines (or pairs of lines) that select individual memory cells along a row to read data from, or write data to, the cells in the selected row.

During testing, predetermined data or voltage values are typically written to selected row addresses, or row and column addresses, that correspond to certain memory cells, and then the voltage values are read from those memory cells to determine if the read data matches the data written to those addresses. If the read data does not match the written data, then the memory cells at the selected addresses likely contain defects and the semiconductor devices fail the test.

A person testing the several dies on the wafer can then examine a particular die itself, by means of a microscope, to determine if failures occurred from masking defects, during the deposition of certain layers, and so forth. During the initial development of a semiconductor device, and while the device is in die form, changes to masks can be made to compensate for most detected failures. However, once a semiconductor device is in production and packaged as a chip, redundant circuitry on the semiconductor device can be employed to compensate for only certain detected failures. Redundant circuitry on the semiconductor device cannot compensate for many detected failures, and therefore, such failed devices must generally be discarded.

Semiconductor manufacturers, to increase output of acceptable semiconductor devices, strive to perform rapid testing of the semiconductor devices to expose defects in the devices before shipping them to a vendor or user. A semiconductor device can be most thoroughly tested when the device is still in die form on the semiconductor wafer. Semiconductor wafers, however, are often difficult to manipulate, and typically require a test bed or other apparatus to releasably secure the wafer while the probes are adjusted to contact the pads on each die on the wafer. As a result, testing of semiconductor devices in die form is time consuming. Therefore, semiconductor manufacturers desire to test a given semiconductor device after it has been packaged as a semiconductor chip, because the chip can be automatically inserted into a test socket for testing using pick and place machinery. Automated testing circuitry can then apply predetermined voltages and signals to the chip, write test patterns thereto, and analyze the results therefrom to detect for failures in the chip.

Often, the number of pads on a die is greater than the number of pins on the packaged semiconductor chip. Therefore, as noted above, certain tests performed while the semiconductor device is in die form cannot be performed on the device after it has been packaged. As a result, package chips necessarily undergo less rigorous testing than unpackaged dies. Packaged chips therefore can include manufacturing defects that are not yet failures and thus are undetectable by the limited number of tests capable of being performed on the packaged chips.

For example, to test for the above-identified cell-to-cell defect, a test circuit writes a pattern of higher than average voltage values (as logical "1" values) to memory cells coupled to or "along" several row lines, while writing low voltage values (as logical "0" values) to memory cells along the adjacent row lines. The test circuit then determines whether the memory cells along the adjacent row lines maintain a logical "0" value. If not, then the logical "1" value written to a first memory cell has shorted to an adjacent memory cell, causing the low voltage or logical "0" value to rise to become a high voltage or logical "1" value.

The time required for the high voltage value in the first memory cell to raise the voltage in the adjacent memory cell will vary depending upon the severity of the defect between the cells. As a result, a high voltage value over a continuous period of time must be applied to the memory cells along the first row lines to force the failure to the memory cells along the adjacent row lines. External test circuitry typically must apply such a continuous, high voltage value to the semiconductor memory device while the device is still in its die form.

Some semiconductor memory devices include an on-chip voltage pump that provides a boosted voltage, greater than the supply voltage Vcc, that can provide the continuous, high voltage value to memory cells along several row lines. However, typical 16 megabit DRAM circuits contain 4096 row lines. As a result, to test only memory cells along half of the row lines over the period required to force a cell-to-cell defect, when the voltage pump can activate only several row lines at a time, requires a prolonged test cycle for each packaged chip. Consequently, cell-to-cell defects cannot be efficiently tested in packaged chips. As a result, cell-to-cell defects can typically only be tested efficiently when the semiconductor memory device is in die form. Probes access the voltage pump circuit and apply supplemental power to the device being tested to thereby simultaneously provide the high voltage value to multiple row lines over the continuous test period. Such a cell-to-cell stress test, however, suffers from the above-described difficulties in testing semiconductor memory circuits when in die form. Therefore, any time saved by conducting the cell-to-cell stress test while the semiconductor device is in die form is offset by the time consuming process of manipulating and testing semiconductor wafers.

SUMMARY OF THE INVENTION

The present invention allows packaged semiconductor chips, such as DRAMs and other semiconductor memory devices, to undergo certain tests when in packaged form, where such tests previously had been available only to unpackaged devices (i.e., semiconductor devices in die form). The present invention electrically couples a superfluous pin or lead on the packaged chip to a voltage pump pad Vccp on the die. As a result, power from an external supply can be applied to the die, while in packaged chip form, to thereby efficiently perform certain tests on the semiconductor device. For example, a voltage pump circuit on the die normally has the capacity to provide a high voltage Vccp to activate only a few row lines simultaneously. By coupling the external power supply to supplement the voltage pump capacity, through one of two redundant Vcc pins in the packaged part, multiple row lines can be simultaneously activated. Alternatively, an unused or non-connected pin can be so coupled. As a result, the present invention allows one of the most common defects in DRAMs, cell-to-cell defects, to be rapidly tested in a packaged chip. Since packaged chips can be tested in parallel, using automated equipment, as opposed to testing in die form, the present invention provides a tremendous time saving step during the testing of semiconductor devices.

In a broad sense, the present invention embodies a semiconductor device capable of receiving external power. The semiconductor device includes a semiconductor circuit having a plurality of circuit cells addressable by electrically conductive row and column lines. The semiconductor circuit also has a power altering circuit for receiving external power and providing an altered power signal to the semiconductor circuit. The altered power signal is capable of being provided to the plurality of circuit cells through the plurality of row lines or the plurality of column lines.

A die having the semiconductor circuit and a plurality of input terminals formed thereon has a first input terminal that is electrically coupled to the power altering circuit. A first set of input terminals is coupled to and provides power signals to the semiconductor circuit. A second set of input terminals is coupled to and provides address signals to access circuit cells in the semiconductor circuit through the row and column lines. A third set of input terminals is couple to and provides input signals to and output signals from the semiconductor circuit.

A plurality of electrically conductive leads each have a pin end and a free end. The free ends of first, second and third sets of leads are electrically connected to at least some of the input terminals in the first, second and third sets of input terminals, respectively. At least one of the plurality of leads is a superfluous lead. An electrical conductor is coupled between the first input terminal and the free end of the superfluous lead. This superfluous lead is capable of providing supplementary external power as the altered power signal to the plurality of circuit cells through the electrical conductor, the first input terminal and the plurality of row or column lines. An encapsulated material encapsulates the semiconductor circuit, the die, the free ends of leads and the electrical conductor as a packaged chip.

The present invention also embodies a method of forming a semiconductor device comprising the steps of: (i) providing a die; (ii) forming a semiconductor memory circuit on the die, the semiconductor memory circuit including an array of memory cells accessible by a plurality of row and column lines; (iii) forming a voltage pump circuit electrically coupled to the plurality of memory cells, through the plurality of row lines, to provide a boosted voltage thereto; (iv) forming a plurality of pads on the die, a first pad being electrically coupled to the power altering circuit, a first set of pads being coupled to and providing power signals to the semiconductor memory circuit, a second set of pads being coupled to and providing address signals to access memory cells in the semiconductor memory circuit through the row and column lines, and a third set of pads beings coupled to and providing input signals to and output signals from the semiconductor memory circuit; (v) providing a plurality of electrically conductive leads including a superfluous lead, each lead having a pin end for external electrical coupling; (vi) electrically connecting free ends of first, second and third sets of leads to at least some of the pads in the first, second and third sets of pads, respectively; (vii) electrically connecting a free end of the superfluous lead to the first pad to thereby allow supplementary external power to be provided as the boosted voltage to the plurality of memory cells through the plurality of row lines; and, (viii) encapsulating the die, the semiconductor memory circuit, the voltage pump circuit, and the free ends of the leads as an externally testable packaged device.

The present invention furthermore embodies a method of testing a packaged semiconductor device having a semiconductor memory circuit, a voltage boosting circuit and a plurality of pads formed on a die. The memory circuit has an array of memory cells addressable by electrically conductive row and column lines. The voltage boosting circuit provides a boosted voltage signal to the memory circuit. A first set of pads is coupled and provides power signals to the semiconductor memory circuit, a second set of pads is coupled to and provides address signals to access memory cells in the semiconductor memory circuit through the row and column lines, and a third set of pads is coupled to and provides input signals to and output signals from the semiconductor memory circuit. The semiconductor device also has a plurality of electrically conductive leads each having a pin end and a free end. The free ends of first, second and third sets of leads are electrically connected to at least some of the pads in the first, second and third sets of pads, respectively. The method includes the steps of: (I) providing the packaged semiconductor memory device, the memory device having at least one superfluous lead having a free end coupled to the first pad; (ii) applying a predetermined voltage to at least one of the leads in the first set of leads; (iii) applying a predetermined combination of signals to the leads in the first or second sets of leads; (iv) providing external supplementary power to the superfluous lead as the boosted voltage signal; (v) simultaneously applying the boosted voltage signal for a predetermined period of time to a selected number of row lines and thereby writing a high voltage value to a preselected pattern of memory cells in the array of memory cells; (vi) analyzing values stored in the non-selected memory cells; and (vii) determining that the memory device is defective if the high voltage value written to the selected number of memory cells approximately equals a value on a non-selected memory cell.

The present invention solves problems inherent in the prior art of semiconductor testing by allowing certain tests to be performed on packaged semiconductor chips that are available to unpackaged dies, but previously unavailable to packaged chips. As a result, the present invention can rapidly test semiconductor devices for cell-to-cell defects by supplying an external voltage to supplement the voltage pump capacity in a packaged part to simultaneously allow multiple row lines in a memory device to be tested for cell-to-cell short circuiting between memory cells. Other features and advantages of the present invention will become apparent from studying the following detailed description of the presently preferred embodiment, together with the following drawings.

DETAILED DESCRIPTION OF THE INVENTION

Figure 1:
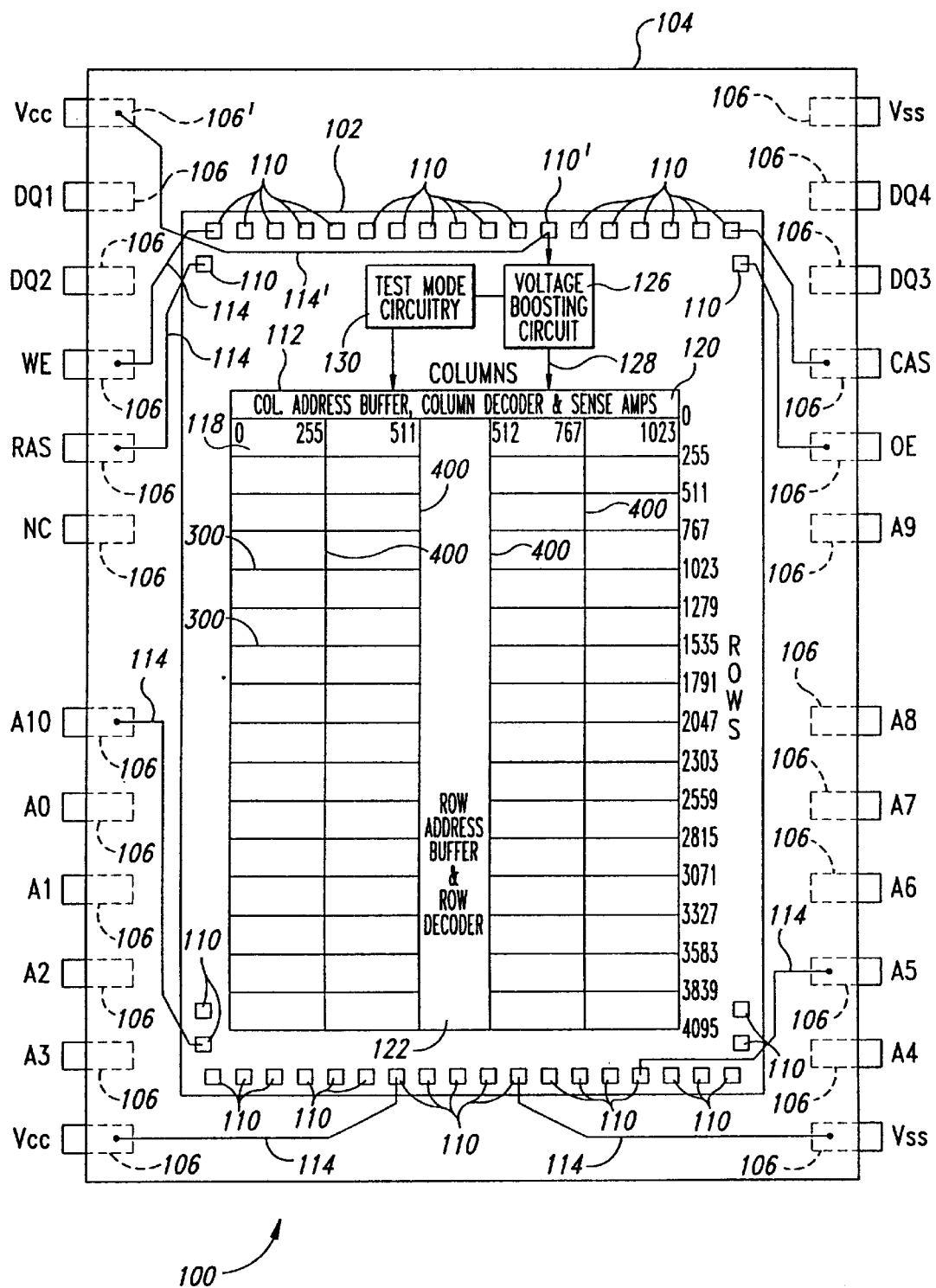
FIG. 1 is a block diagram of a packaged semiconductor memory device under the present invention.

Referring to FIG. 1, a block diagram of a 16 megabit DRAM packaged chip 100 is shown as having a substrate or die 102 encapsulated by a protective material 104 such as epoxy or plastic. Twenty-four electrically conductive leads 106 have a pin end extending from the package chip 100, and a free end (shown in dashed lines) encapsulated within the protective material 104. Several pads 110 are formed on, and at the periphery of, the die 102. The pads 110 are electrically coupled to a semiconductor circuit such as a memory circuit 112 formed on the die 102 and form input terminals for the circuit. As explained more fully below, several of the pads 110 are electrically coupled to the free ends of the leads 106 by means of electrically conductive members such as bond wires 114. As a result, the pin ends of the leads 106 in the packaged chip 100 provide an external electrical path through the bond wire 114 to the die 102.

Each of the twenty-four leads 106 in the package chip 100 typically has an industry specified standard assignment based on the type of semiconductor circuit formed on the die 102. An acronym for the assignment of each pin in the exemplary 16 megabit packaged chip 100 is shown next to the pin end of the leads 106, and are as follows: positive voltage supply pins Vcc, data input/output pins DQ1–DQ4, address pins A0–A10, write enable pin WE, row address select pin RAS, column address select pin CAS, output enable pin OE, negative or ground voltage supply pins Vss, and a non-connected pin NC. While the general type of signals applied to each pin are established by industry standards, the particular voltages and timing of the signals applied to each pin often vary between packaged chips 100, and between manufacturers of similar semiconductor circuits.

Several pads 110 shown in FIG. 1 have acronyms that are identical to the pin assignment acronyms for the twenty-four leads 106. The free end of each lead 106 is electrically coupled to its appropriate pad 110 by means of bond wires 114. For example, the lead 106 associated with the A10 pin is coupled to the A10 pad 110 by means of the wire 114, while the leads associated with the Vss pins are similarly coupled to Vss pads. Unlabeled pads generally indicate pads accessible by probes during testing of the die 102 prior to being packaged as the package chip 100, but which are not connected to any leads 106.

External signals are applied to the semiconductor memory circuit 112 by means of the pin ends of the leads 106. Therefore, the address pins A0 through A9 receive address signals to access particular memory cells in the memory circuit 112. An external power supply provides the positive supply voltage Vcc to the package chip 100 by means of one of the Vcc pins, while a negative or ground supply voltage Vss is applied to one or both of the Vss pins. Specified input and output signals are exchanged by means of the WE, RAS, CAS, OE, and DQ1–DQ4 pins.

The memory circuit 112 includes arrays of memory cells 118 that are accessed by digit or column lines 400 and word or row lines 300. For a 16 megabit memory array, the memory circuit 112 preferably includes 1,024 column lines 400 and 4,096 row lines 300 for each of four memory cell arrays. As is known in the art, individual memory cells in each memory cell array 118 are addressed by activating one of the row lines 0 through 4,095, and then activating the appropriate column lines 0 through 1,023.

Data is written to, and read from, memory cells in the memory cell array 118 by means of column circuitry 120, and row circuitry 122. The column circuitry 120 includes a column address buffer, a column decoder and sense amplifiers, while the row circuitry 122 includes a row address buffer and a row decoder. The column and row circuitry 120 and 122 also includes refresh controllers and counters, clock generators, data in/out buffers, and other circuitry known in the semiconductor memory art.

As shown in FIG. 1, the packaged chip 100 has several pins that have redundant assignments. A lead 106', forming one of the two redundant Vcc pins, has a free end electrically coupled to a Vccp pad 110' by means of a bond wire 114'. The Vccp pad 110' is electrically coupled to a voltage boosting or pump circuit 126 that generates a voltage greater than the Vcc voltage. For example, if Vcc is equal to 3 volts, then Vccp equals 4.5 volts. The voltage boosting circuit 126 applies the boosted voltage Vccp to the row lines 300 in the memory circuit 112 through a Vccp bus 128 to memory cells along the row lines.

To determine the difference between a stored high voltage value and a stored low voltage value in a memory cell (i.e., between a logical "1" value and a logical "0" value), sense amplifiers in the column circuitry 120 typically sense a change in voltage from an equalized level (preferably Vcc/2). To maximize the voltage change, semiconductor memory devices bootstrap the row lines 130 above the supply voltage Vcc to a value of Vccp, to thereby allow a high voltage value equal to Vcc to be written into the memory cells.

The voltage boosting circuit 126 need only supply such a boosted voltage to several row lines simultaneously under normal operation. Under a testing mode of operation, where Vcc is equal to a maximum tolerant voltage, e.g., 5 volts, then the voltage boosting circuit 126 allows the memory circuit 112 to write a full 5 volts to memory cells. The voltage boosting circuit 126, however, has the capacity to provide a boosted voltage Vccp to only several row lines simultaneously in the memory circuit 112. By coupling an external power supply 176 (shown in FIG. 5) to the lead 106', supplementary current can be provided through the bond wire 114' to over half of the row lines in the memory circuit 112. Test mode circuitry 130 formed on the die 102 and coupled to the memory circuit 112 and the voltage boosting circuit 126 allows the memory circuit to be tested under several test routines when a predetermined. series of steps are initially performed on the package chip 100, as described more thoroughly below.

Figure 2:
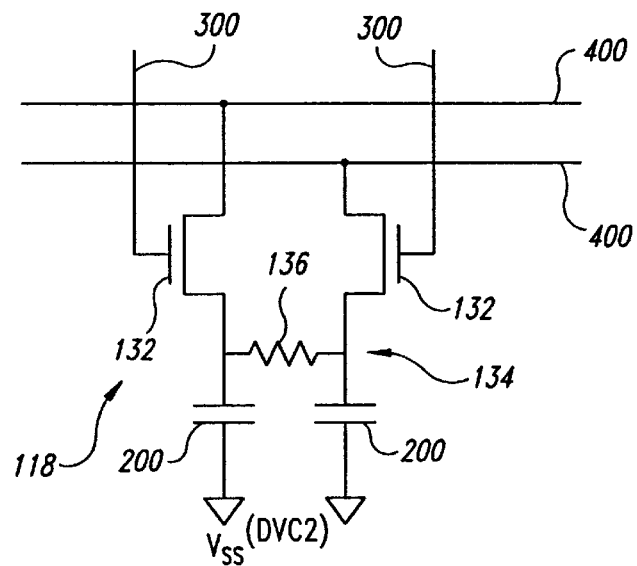
FIG. 2 is a schematic diagram of two memory cells from the semiconductor memory device of FIG. 1, which shows a defect short circuiting the two cells.

Referring to FIG. 2, two memory cells from the memory cell array 118 are shown. Each memory cell includes a transistor 132 that accesses a capacitor 200 that stores a high or low voltage value (i.e., a logical "1" or "0" value). Row lines 300 are coupled to the gates of the transistors 132, while column lines 400 are coupled to the collectors of the transistors. Depending upon the configuration of the memory circuit 112, if four memory cell arrays 118 are employed, then a single column address would access four capacitors 200 by means of four row or column lines. To simplify the discussion herein, however, only a single memory cell array 118 is described in detail.

During fabrication of the memory cell array 118, a defect 134 can occur between the two capacitors 200, which provides a resistive short circuit between the capacitors. Therefore, the defect 134 is shown as a resistor 136 coupled between the capacitors 200 in FIG. 2. The defect 134 can be caused by a polysilicon particle erroneously deposited between the upper plates of the capacitors 200 during fabrication of the memory cell array 118.

Figure 3:
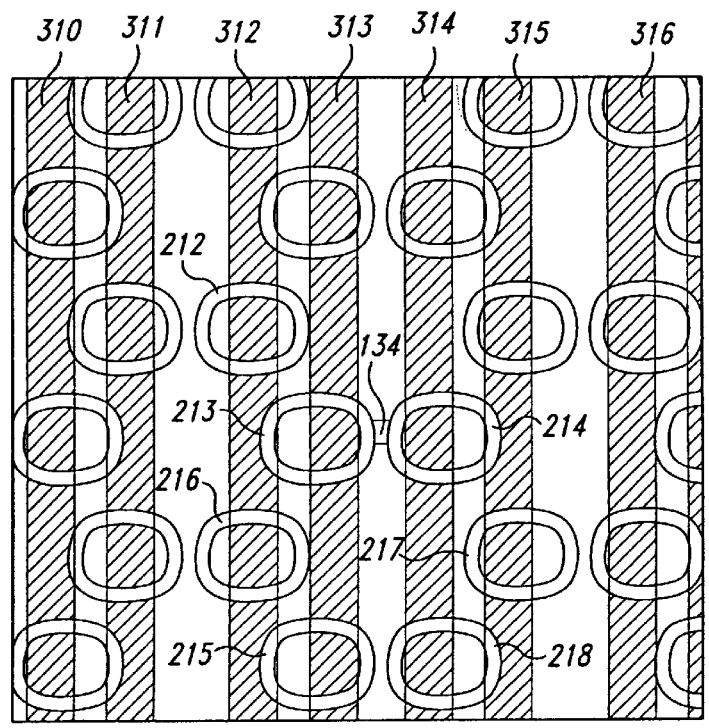
FIG. 3 is a scanning electron microscope photograph of several memory cells from the semiconductor memory device of FIG. 1 showing a polysilicon defect between two memory cells.

The photograph of FIG. 3 shows such a defect. A polysilicon particle forming the defect 134 is shown between the upper (storage) plates, of capacitors 213 and 214 (shown as rings), which are coupled along row lines 313 and 314. As used herein, when particular row and column lines are referred to herein, the particular row lines are preceded by the number "3", while particular column lines are preceded by the number "4". Therefore, row lines 10–15 are numbered 310–315, while column lines 10–15 are numbered 410–415. Similarly, particular capacitors are preceded by the number "2", e.g., capacitors 13 and 14 are numbered 213 and 214. Capacitors coupled to, or accessed by, row lines enumerated by an odd number are similarly enumerated by an odd number, and vise versa. For example, capacitors 213 and 215 are accessed by row line 313, while capacitors 214 and 218 are accessed by row line 314.

The polysilicon particle defect 134 between the capacitors 213 and 214 provides an electrically conductive path between the capacitors resulting in the above-described cell-to-cell defect. As a result, if a high voltage or logical "1" value is written to the capacitor 213, while a low voltage or zero value is written to the capacitor 214, the logical "1" value on the capacitor 213 will be forced onto the capacitor 214 over a period of time.

In a test mode of operation, the present invention preferably writes high voltage values to memory cells in the memory cell array 118 in a checkerboard pattern, while a low value is written to the remaining cells. The high voltage values are maintained in the cells for a sufficient period of time to stress a defect between cells into becoming a failure. In other words, the high voltage value is maintained until the high value is forced through the polysilicon particle or other defect 134 into an adjacent cell. The values on the adjacent cells are then read, and if any have a logical "1" value, then one or more defects 314 are located.

Figure 4:
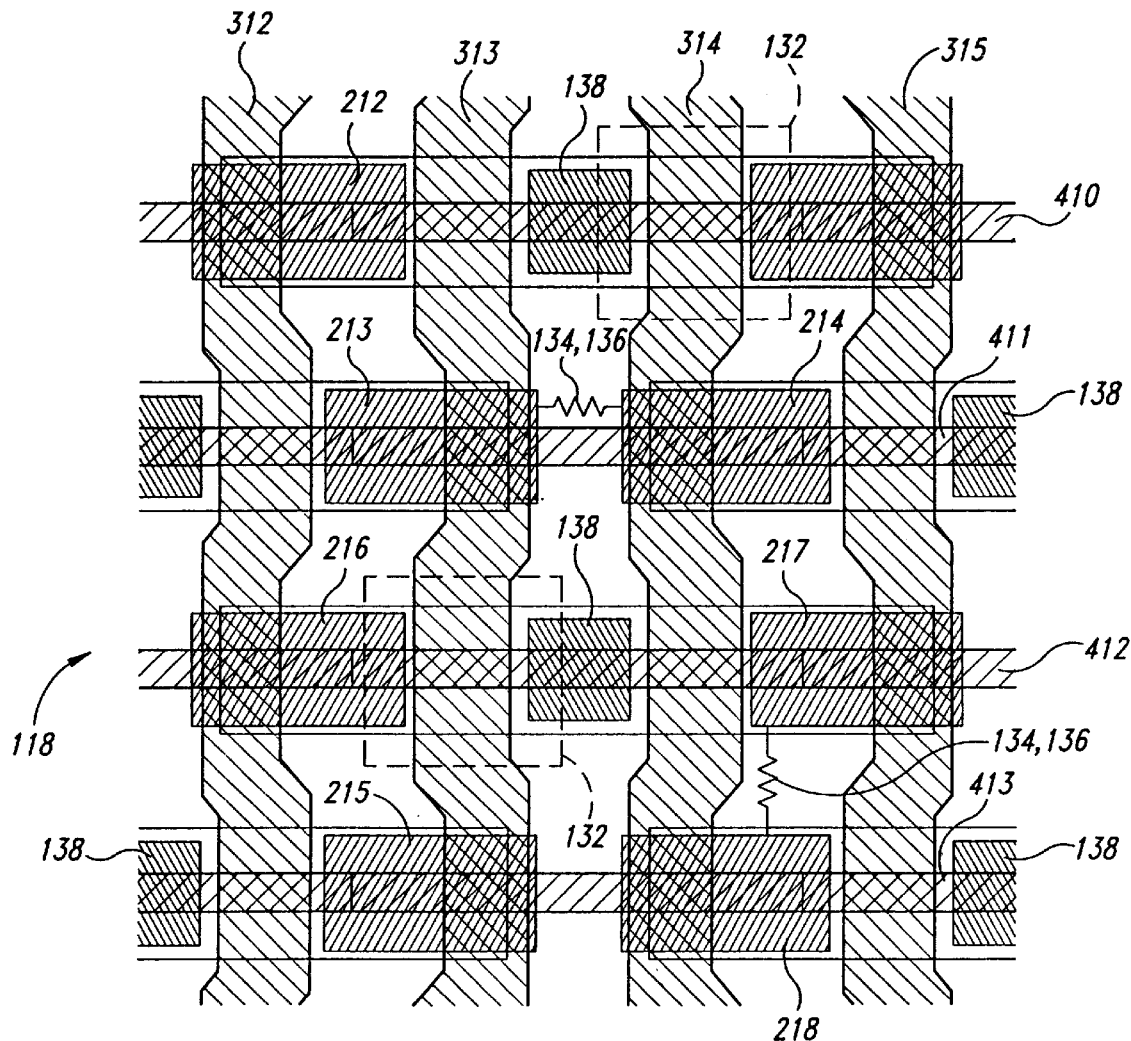
FIG. 4 is a greatly enlarged plan view of memory cells for the semiconductor memory circuit of FIG. 1 showing the physical layout of the memory cells.

As shown by the preferred layout of the capacitors 200 in FIGS. 3 and 4, the capacitors are staggered between rows and columns so that row line 313 accesses capacitors 213 and 215, while row line 314 accesses capacitors 214 and 218. Therefore, by writing a logical "1" value to the capacitors 213 and 215 along the row line 313, and a logical "0" value to the capacitors in the adjacent row lines 312 and 314, defects between these capacitors and the adjacent capacitors 212 and 216, and 214 and 218, respectively, can be discovered. Column contacts 138 (FIG. 4) extending from an upper surface of the die 102 upward to the column lines 400 separate certain capacitors, such as capacitors 216 and 217, and therefore shorts between these capacitors are very unlikely.

As shown in FIG. 4, the polysilicon particle defect 134 forming the resistive short 136 can occur between memory cells along a given column line, for example, between capacitors 213 and 214 along the column line 411. Similarly, a defect 134' forming a resistive short 136' can occur between memory cells along different column lines, for example, between the capacitors 217 and 218 along column lines 412 and 413, respectively. Due to the layout of the memory cells, and the checkerboard test pattern applied thereto, the present invention can detect for both of such defects 134 and 134' occurring between pairs of memory cells by simply writing high voltage values to capacitors along alternate or every other row line in the memory cell array 118. Of course, the present invention can also detect for defects that span three or more memory cells.

Figure 5:
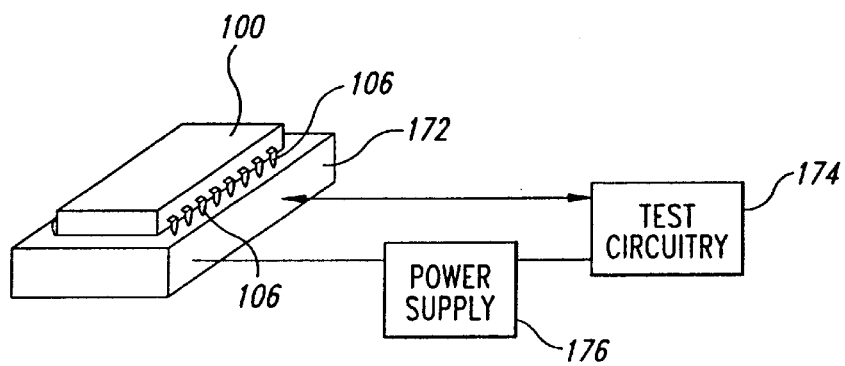
FIG. 5 is a partial isometric, partial block diagram of a testing station for testing the packaged semiconductor memory device of FIG. 1.

Referring to FIG. 5, a testing station 170 for testing the packaged chip 100 of the present invention is shown as having a socket 172 for releasably holding the chip and providing electrical interconnection between the leads 106 and external test circuitry 174. An external power supply 176 coupled to the socket 172 and the test circuitry 174 provides supplementary power to the Vccp bus 128, through the lead 106' and Vccp pad 110'.

Since the external power supply 176 can be coupled to the Vccp bus 128 through the lead 106' and bond wire 114', the test mode circuitry 130 of the present invention is able to provide sufficient current along every other row line 300 in the memory cell array 118 to simultaneously write high voltage or logical "1" values to the capacitors along those row lines and generate the desired checkerboard test pattern. Additionally, the external power supply 176 can also maintain the logical "1" value in the capacitors along every other row line 300 for a sufficient period of time to force defects between cells, allow the logical "1" value to leak through resistive shorts 136 to adjacent capacitors, and raise the logical "0" value on those capacitors to a logical "1" value. By permitting simultaneous and sustained writing of logical "1" values to memory cells along every other row line in the memory cell array 118, the present invention can rapidly test a large memory circuit 112. Since the external power supply 176 can provide such power to the memory circuit 112 after it has been manufactured into the package chip 100, automated pick and place machinery (not shown) can manipulate the chip and insert it into the test socket 172 for testing it to even more rapidly test the memory circuit 112.

Figure 6:
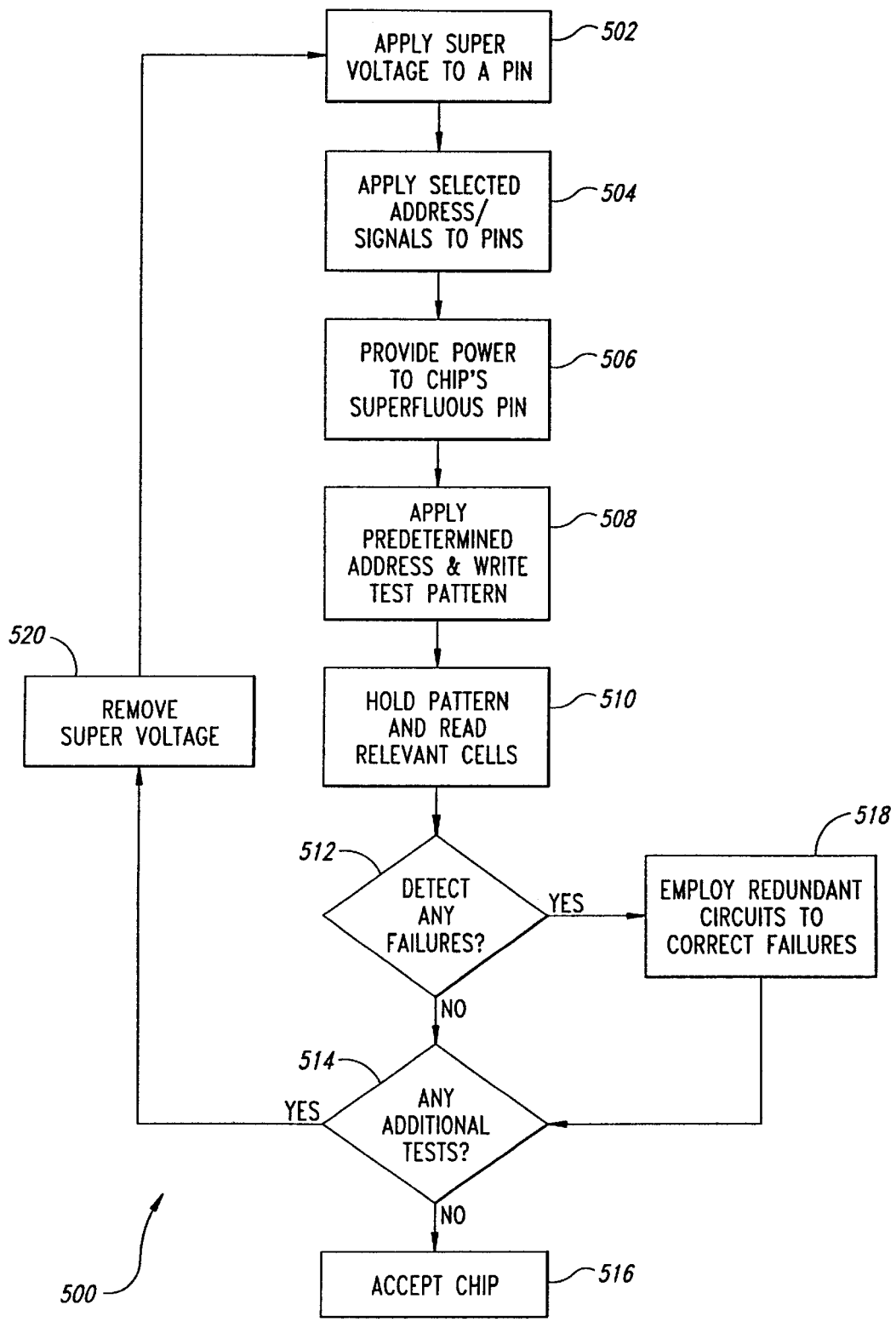
FIG. 6 is a flowchart diagram of the steps performed by the testing station of FIG. 5.

The test circuitry 174 of the test station 170 preferably includes microprocessor or microcontroller circuitry and memory for performing a stress test routine, such as the routine shown in FIG. 6. Referring to FIG. 6, an exemplary routine 500 performed by the test circuitry 174 begins in step 502 by applying a continuous super voltage (such as 10 volts) to a pin of the package chip 100 such as the non-connected pin NC or the Vcc pin. Such a super voltage is one beyond the normal tolerances for the package chip 100 and therefore would not normally be applied to the chip by a user under normal conditions.

In step 504, the test circuitry 174 provides a predetermined address to address pins A0-A9 to initiate the test mode circuitry 130 on the die 102 (FIG. 1). The test circuitry 174 in step 504 can alternatively apply a predetermined combination of signals to pins other than the address pins. For example, the test circuitry 174 in step 504 can alter the timing of signals applied to the write enable pin WE, the column address select pin CAS, and the row address select pin. The address or signals applied to the pins in step 504 are preferably selected to be signals not normally applied to such pins by a user during normal operation of the package chip 100, and therefore, a user would not accidentally enter the test mode for the chip.

In step 506, the test circuitry 174 causes the power supply 176 to provide supplementary power to the Vcc pin, which is applied to the Vccp bus 128 through the voltage boosting circuit 126, Vccp pad 110', bond wire 114' and lead 106'. Thereafter, in step 508, the test circuitry 174 provides a second predetermined address or combination of signals to the address pins A0–A9, which causes the test mode circuitry 130 in the packaged chip 100 to enter into a test mode that causes logical "1" values to be written to every memory cell along all even numbered row lines 300. In step 510, the test mode circuitry 130 also causes a "0" value to be written to all of the memory cells along the odd row lines 300.

After a predetermined period of time, in step 510, the test circuitry 174 reads selected memory cells, namely those memory cells along the odd row lines 300, to determine if any of them have a logical "1" value. If in step 512, the test circuitry 174 determines that no adjacent cells have a logical "1" value, i.e., that no failures exist, then in step 514, the test circuitry determines whether any additional tests are to be performed on the chip 100. If not, then the chip 100 is deemed acceptable in step 516.

Otherwise, if any of the memory cells along the odd numbered row lines 300 have a logical "1" value, then the test circuitry 174 in step 512 identifies such failures.

Thereafter, in step 518, the test circuitry 174 enables redundant circuitry on the packaged chip 100 to compensate for the failure by blowing certain fuses or leads in the chip (if the chip has such redundant circuitry). If the test circuitry 174 determines in step 514 that additional tests are to be performed on the chip 100, then the test circuitry removes the super voltage from the NC or Vcc pin in step 520. Steps 502 through 518 are thereafter performed for additional tests until the chip 100 is accepted in step 516. (The routine 500 assumes that all detected failures are correctable in step 518; if they are not, then the chip 100 is discarded.)

The above-described packaged chip 100 relies on two criteria. First, the invention relies on an industry standard for memory devices that assigns two leads for the power supply Vcc (i.e. has redundantly assigned pins). Second, the invention relies on efficient bussing of power within the packaged chip 100. The packaged chip 100 need not have both Vcc pins coupled to the Vcc bus (not shown) of the memory circuit 112 because the Vcc bus preferably provides sufficient voltage to the entire memory circuit 112 through one of the Vcc pins due to the configuration of the Vcc bus in the memory circuit 112. If the Vcc bus fails to provide sufficient voltage to the entire memory circuit 112, an alternative configuration can be employed where a bond wire couples one of the Vcc leads to several Vcc pads on the die 102, thereby freeing up one Vcc lead. Therefore, while the packaged chip 100 includes two Vcc pins because of industry standards, only one such pin is required to supply an external supply voltage to the memory circuit 112.

Figure 7:
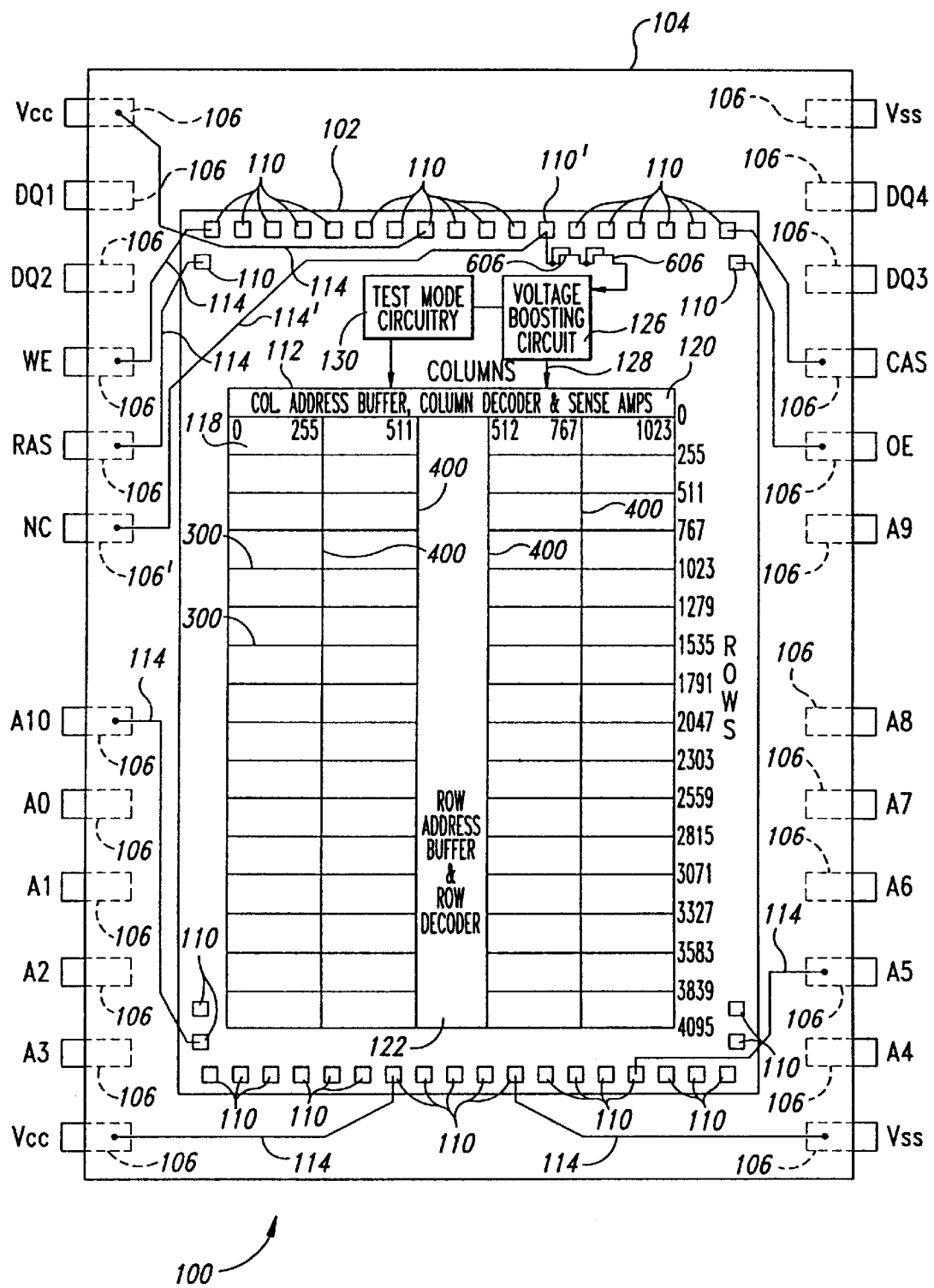
FIG. 7 is a block diagram of an alternative embodiment of the package semiconductor memory device of FIG. 1.

Not all chips, however, have redundantly assigned Vcc pins, therefore, referring to FIG. 7, an alternative embodiment of the present invention is shown as the package chip 600. The alternative embodiment of FIG. 7 is similar to the previously described embodiment, and all elements are similarly numbered when of similar construction. Only the significant differences in construction or operation are discussed in detail.

The bond wire 114', rather than being coupled to the free end of the lead 106' of one of the Vcc pins, is instead coupled to the free end of the non-connected pin NC. As a result, for chips assigned to have only one Vcc pin (and one Vss pin), the alternative embodiment of FIG. 7 can permit such chips to employ the present invention, assuming these chips have a non-connected pin NC. The alternative embodiment of FIG. 7 allows the supply voltage Vcc to be applied to both of the Vcc pins.

To protect the voltage boosting circuit 126 and the memory circuit 112 from a negative voltage applied to the NC pin, one or more protection diodes (shown as diode connected transistors 606) are connected between the Vccp pad 110' and the voltage boosting circuit 126. The diode connected transistor 606 can also be employed in the package chip 100 of FIG. 1. Additional protection circuitry can be integrated on the die 102 to protect the memory circuit 112 from externally applied signals.

As explained above, by permitting the external power supply 176 to provide supplementary power to the Vccp bus 128 when the memory circuit 112 is incorporated into the package chip 100, the memory circuit can be more rapidly tested than when it is unpackaged. The present invention allows for more rapid testing, including burn-in testing of the memory circuit 112. "Burn-in" testing refers to the process of accelerating failures in the memory circuit that occur during the infant mortality phase of the circuit's life to thereby remove inherently weaker circuits. "Infant mortality" refers to those memory circuits 112 that would fail early in their lives due to manufacturing defects. The burn-in process is performed on packaged chips, prior to their shipping to customers. The burn-in process is typically performed at a specified temperature and with specified voltage values for a specified period of time. The burn-in process is an automated process performed on the packaged chips, and therefore, the present invention is ideally suited for allowing the above-described cell-to-cell stress test to be performed on such chips during the burn-in process. As a result, the burn-in process can provide more effective testing of packaged chips before being deemed acceptable devices.

While the detailed description has been expressed, in part, in terms of specific examples, those skilled in the art will appreciate that many other variations could be used to accomplish the purpose of the disclosed invention. For example, those skilled in the art will recognize that the bond wire 114', Vccp bus 128, and lead 106', and other circuits described herein, must have sufficient capacity to handle the current and voltage required to simultaneously write a high voltage to alternate rows in the memory array 118 under the cell-to-cell stress test. Additionally, while the bond wire 114' is described above as being coupled to one of two Vcc pins, the wire could also be coupled to one of two Vss pins. Overall, the bond wire 114' can be coupled to any redundantly assigned pin, non-connected pin or pin unused by the memory circuit 112 (such as the address pin A10).

Those skilled in the art will recognize that the present invention is described above for testing DRAM circuits, however, the present invention can be readily adapted to test other packaged semiconductor memories or circuitry. Accordingly, it can be appreciated that equivalent modifications to the above-described embodiments can be made without departing from the spirit and scope of the invention. Therefore, the present invention is limited only by the following claims.

What is claimed is:

1. A method of testing a packaged semiconductor device having a semiconductor memory circuit, a voltage boosting circuit and a plurality of pads formed on a die, the semiconductor memory circuit having an array of memory cells addressable by electrically conductive row and column lines, the voltage boosting circuit providing a boosted voltage signal to the semiconductor memory circuit, a first set of pads being coupled to and providing power signals to the semiconductor memory circuit, a second set of pads being coupled to and providing address signals to access memory cells in the semiconductor memory circuit through the row and column lines, and a third set of pads being coupled to and providing input signals to and output signals from the semiconductor memory circuit, the packaged semiconductor device also having a plurality of electrically conductive leads each having a pin end and a free end, the free ends of first, second and third sets of leads being electrically connected to at least some of the pads in the first, second and third sets of pads, respectively, the method comprising the steps of:

providing the packaged semiconductor memory device, the packaged semiconductor device having at least one superfluous lead having a free end coupled to one of the pads in the first set of pads;

applying a predetermined voltage to at least one of the plurality of leads;

applying a predetermined combination of signals to the leads in the first or second sets of leads;

providing external supplementary power to the superfluous lead as the boosted voltage signal;

simultaneously applying the boosted voltage signal for a predetermined period of time to a selected number of row lines;

analyzing values stored in non-selected memory cells of the array of memory cells; and determining that the packaged semiconductor device is defective if a non-selected memory cell has a voltage value written thereto.

2. The method of claim 1 wherein the step of applying a predetermined voltage applies a voltage greater than a supply voltage applied to the memory device during normal operation of the packaged semiconductor device.

3. The method of claim 1 wherein the step of applying a predetermined voltage includes the step of applying to the at least one lead in the first set of leads a voltage greater than a supply voltage applied to the semiconductor memory circuit.

4. The method of claim 1, further comprising the step of forming a test mode circuit on the die, and wherein the step of providing a predetermined combination of signals includes the steps of:

applying preselected signals to at least some of the pads in one of the second and third sets of pads;

initiating a test mode for the semiconductor memory circuit; and allowing alternate row lines in the plurality of row lines to receive the external supplementary power.

5. The method of claim 1 wherein the step of simultaneously applying the boosted voltage signal includes the step of providing the boosted voltage signal to approximately half of the array of memory cells in a checkerboard pattern.

6. The method of claim 1, further comprising the step of protecting the voltage boosting circuit from a negative voltage that could be applied to the at least one superfluous lead.

7. The method of claim 1, further comprising the step of automatically inserting the packaged semiconductor device into a test socket before the step of applying a predetermined voltage.

8. The method of claim 1 wherein the step of applying a predetermined combination of signals includes the step of entering the semiconductor memory circuit into a preselected test mode, the preselected test mode allowing a greater number of memory cells in the array of memory cells to be simultaneously accessed than a number of memory cells which can be accessed during a non-test mode of the semiconductor memory circuit.

9. A method of testing a packaged semiconductor device having a semiconductor memory circuit and a plurality of pads formed on a die, the memory circuit having a plurality of addressable memory cells, the packaged semiconductor device also having a plurality of electrically conductive leads each having an externally accessible end and a free end, the free ends of the leads being electrically connected to at least some of the plurality of pads, the method comprising the steps of:

providing the packaged semiconductor device, the packaged semiconductor device having at least one selected lead having a free end coupled to one of the plurality of pads, the selected lead capable of being unused during standard operation of the packaged semiconductor device;

initiating a test mode for the memory circuit;

providing a voltage signal to the selected lead greater than a supply voltage for the packaged semiconductor device;

simultaneously applying the greater voltage signal for a predetermined period of time to a selected plurality of memory cells in the plurality of memory cells;

analyzing values stored in non-selected memory cells in the plurality of memory cells; and determining that the packaged semiconductor device is defective if one or more non-selected memory cells have a voltage value written thereto.

10. The method of claim 9 wherein the plurality of pads include a first set of pads being coupled to and providing power signals to the memory circuit, a second set of pads being coupled to and providing address signals to access memory cells in the memory circuit, and a third set of pads being coupled to and providing input signals to and output signals from the memory circuit, wherein the step of providing the packaged semiconductor device includes the step of coupling the selected lead to a pad in the first set of pads.

11. The method of claim 9 wherein the step of initiating a test mode includes the steps of:

applying a predetermined voltage to at least one of the plurality of leads; and applying a predetermined combination of signals to a selected set of leads in the plurality of leads.

12. The method of claim 9 wherein the step of initiating a test mode includes the steps of:

applying a predetermined voltage to at least one of the plurality of leads, the predetermined voltage being a voltage greater than the supply voltage supplied to the packaged memory circuit during standard operation of the packaged semiconductor device; and applying a predetermined combination of signals to a selected set of leads in the plurality of leads.

13. The method of claim 9 wherein the plurality of addressable memory cells includes a plurality of row lines, and wherein the step of initiating a test mode includes the steps of:

forming a test mode circuit on the die;

applying preselected signals to a selected set of leads in the plurality of leads; and allowing alternate row lines in the plurality of addressable memory cells to receive the greater voltage signal.

14. The method of claim 9 wherein the step of simultaneously applying the boosted voltage signal includes the step of writing the boosted voltage signal to approximately half of the plurality of memory cells in an alternating pattern.

15. The method of claim 9, further comprising the step of protecting the memory circuit from an application, to the at least one selected lead of a power signal having a polarity opposite of a polarity of the greater voltage signal.

16. The method of claim 9, further comprising the step of automatically coupling the packaged semiconductor device to a test socket before the step of initiating a test mode.

17. The method of claim 9 wherein the step of initiating a test mode includes the step of allowing a greater number of memory cells in the plurality of memory cells to be simultaneously accessed than a number of memory cells in the plurality of memory cells that can be accessed during a non-test mode.

18. A method of testing a packaged semiconductor device comprising the steps of:

providing a semiconductor memory circuit, a voltage boosting circuit and a plurality of pads formed on a die, the memory circuit having a plurality of memory cells addressable by electrically conductive row and column lines, and the voltage boosting circuit providing a boosted voltage signal to the memory circuit greater than a supply voltage for the packaged semiconductor device;

providing a first set of pads being coupled to and providing power signals to the semiconductor memory circuit;

providing a second set of pads being coupled to and providing address signals to access memory cells in the semiconductor memory circuit through the row and column lines;

providing a third set of pads being coupled to and providing input signals to and output signals from the semiconductor memory circuit;

providing a plurality of electrically conductive leads each having an externally accessible end and a free end, the free ends of first, second and third sets of leads being electrically connected to at least some of the pads in the first, second and third sets of pads, respectively;

providing at least one redundant lead having a free end coupled to a first pad in the first set of pads;

applying a predetermined voltage to at least one of the plurality of leads;

applying a predetermined combination of signals to the leads in the first or second sets of leads;

providing a power signal, substantially similar to the boosted voltage signal to the redundant lead;

writing a high voltage value to a preselected pattern of memory cells in the array of memory cells for a predetermined period of time;

analyzing values stored in non-selected memory cells in the array of memory cells; and determining that the memory device is defective if the high voltage value written to the preselected pattern of memory cells approximately equals a value in a non-selected memory cell.

19. The method of claim 18 wherein the step of applying a predetermined voltage includes the step of applying a voltage greater than the supply voltage applied to the semiconductor memory circuit during normal operation of the semiconductor memory circuit.

20. The method of claim 18, further comprising the step of forming a test mode circuit on the die, and wherein the step of providing a predetermined combination of signals includes the steps of:

applying preselected signals to at least some of the pads in one of the second and third sets of pads;

initiating a test mode for the semiconductor memory circuit; and allowing alternate row lines in the plurality of row lines to receive the external supplementary power.

21. The method of claim 18 wherein the step of writing a high voltage value includes the step of providing the power signal to approximately a half of the array of memory cells, the half of the memory cells being arranged in a checkerboard pattern.

22. The method of claim 18, further comprising the step of protecting the voltage boosting circuit from a negative voltage applied to the at least one redundant lead.

23. The method of claim 18, further comprising the step of automatically inserting the packaged semiconductor device into a test socket before the step of applying a predetermined voltage to at least one of the plurality of leads.

24. The method of claim 18 wherein the step of applying a predetermined combination of signals includes the step of entering the semiconductor memory circuit into a preselected test mode, the preselected test mode allowing a greater number of memory cells to be simultaneously accessed than a number of memory cells in the array of memory cells which can be accessed during a non-test mode.

* * * * *